United States Patent
Jeong

(10) Patent No.: US 9,853,641 B2
(45) Date of Patent: Dec. 26, 2017

(54) INTERNAL VOLTAGE GENERATION CIRCUIT

(71) Applicant: SK hynix Inc., Icheon-si, Gyeonggi-do (KR)

(72) Inventor: Bong Hwa Jeong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/094,950

(22) Filed: Apr. 8, 2016

(65) Prior Publication Data

US 2017/0117897 A1 Apr. 27, 2017

(30) Foreign Application Priority Data

Oct. 26, 2015 (KR) .................. 10-2015-0148454

(51) Int. Cl.
| | |
|---|---|
| *H03K 3/017* | (2006.01) |
| *H03K 19/0185* | (2006.01) |
| *G11C 5/14* | (2006.01) |
| *H03K 5/14* | (2014.01) |
| *H03K 5/156* | (2006.01) |
| *H03K 5/00* | (2006.01) |

(52) U.S. Cl.
CPC ..... *H03K 19/018507* (2013.01); *G11C 5/147* (2013.01); *H03K 5/14* (2013.01); *H03K 5/1565* (2013.01); *H03K 2005/00234* (2013.01)

(58) Field of Classification Search
None
See application file for complete search history.

(56) References Cited

U.S. PATENT DOCUMENTS

| | | | | |
|---|---|---|---|---|
| 5,672,990 | A * | 9/1997 | Chaw | H03K 5/133 327/172 |
| 6,211,709 | B1 * | 4/2001 | Kim | H03K 5/1534 327/172 |
| 7,236,038 | B2 * | 6/2007 | Wu | G06F 1/04 327/172 |
| 7,728,628 | B2 * | 6/2010 | Chiang | H03K 3/012 326/68 |
| 2004/0041608 | A1 * | 3/2004 | Jinbo | G11C 8/18 327/172 |
| 2005/0231293 | A1 * | 10/2005 | Confalonieri | H03H 11/26 331/57 |
| 2005/0237848 | A1 | 10/2005 | Takahashi et al. | |
| 2006/0152262 | A1 * | 7/2006 | Park | G11C 7/08 327/172 |
| 2007/0205819 | A1 * | 9/2007 | Park | H03K 5/06 327/288 |
| 2009/0134922 | A1 * | 5/2009 | Chen | H03K 5/06 327/143 |

(Continued)

FOREIGN PATENT DOCUMENTS

KR 10-2009-0027106 A 3/2009

*Primary Examiner* — Cassandra Cox
(74) *Attorney, Agent, or Firm* — William Park & Associates Ltd.

(57) ABSTRACT

An internal voltage generation circuit may be provided. The internal voltage generation circuit may include a pulse generation circuit configured to generate a first pulse and a second pulse in response to an external voltage. The internal voltage generation circuit may include a pulse synthesis circuit configured for synthesizing the first pulse and the second pulse to generate a synthesis pulse.

18 Claims, 13 Drawing Sheets

(56) References Cited

U.S. PATENT DOCUMENTS

2011/0193595 A1* 8/2011 Fukuda ................. H03K 5/151
　　　　　　　　　　　　　　　　　　　　　327/108
2015/0318855 A1* 11/2015 Song ................. H03K 19/0013
　　　　　　　　　　　　　　　　　　　　　327/108

* cited by examiner

INTERNAL VOLTAGE GENERATION CIRCUIT

CROSS-REFERENCE TO RELATED APPLICATIONS

The present application claims priority under 35 U.S.C 119(a) to Korean Patent Application No. 10-2015-0148454, filed on Oct. 26, 2015, which is incorporated herein by reference in its entirety.

BACKGROUND

1. Technical Field

Embodiments of the present disclosure generally relate to internal voltage generation circuits, and semiconductor memory devices and systems including the same.

2. Related Art

In general, a semiconductor memory device receives an external voltage (e.g., a power supply voltage VDD) and a ground voltage VSS from an external device to generate internal voltages used in operation of internal circuits constituting the semiconductor memory device. The internal voltages for operating the internal circuits of the semiconductor memory device may include a core voltage VCORE, a high voltage VPP, and a back-bias voltage VBB. The core voltage may be supplied to a memory core region. The high voltage VPP may be used to drive or overdrive word lines. The back-bias voltage VBB may be applied to a bulk region (or a substrate) of NMOS transistors in the memory core region.

The core voltage VCORE may be a positive voltage which is lower than the power supply voltage VDD supplied by the external device. Thus, the core voltage VCORE may be generated by lowering the power supply voltage VDD to a certain level. However, the high voltage VPP may be higher than the power supply voltage VDD, and the back-bias voltage VBB may be a negative voltage which is lower than the ground voltage VSS. Thus, charge pump circuits may be required to generate the high voltage VPP and the back-bias voltage VBB.

In addition, the internal voltages used in the semiconductor memory device may include a bit line pre-charge voltage VBLP for pre-charging bit lines and a cell plate voltage VCP applied to a plate electrode of memory cells. The bit line pre-charge voltage VBLP and the cell plate voltage VCP may be set to have the same level (e.g., a half of the core voltage VCORE). Accordingly, the bit line pre-charge voltage VBLP and the cell plate voltage VCP may be generated by internal voltage generation circuits having the same configuration. The internal voltage generation circuits for generating the bit line pre-charge voltage VBLP and the cell plate voltage VCP may be realized to independently or separately operate.

DETAILED DESCRIPTION

Various embodiments may be directed to internal voltage generation circuits adjusting drive of an internal voltage in accordance with a level of an external voltage.

According to an embodiment, an internal voltage generation circuit device may be provided. The internal voltage generation circuit device may include a first pulse generation circuit configured for generating a first pulse having a pulse width which is adjusted by a first variation rate in response to an external voltage. The internal voltage generation circuit device may include a second pulse generation circuit configured for generating a second pulse having a pulse width which is adjusted by a second variation rate in response to the external voltage. The internal voltage generation circuit device may include a pulse synthesis circuit configured for synthesizing the first pulse and the second pulse to generate a synthesis pulse for driving an internal voltage.

According to an embodiment, an internal voltage generation circuit device may be provided. The internal voltage generation circuit device may include a level shifter configured for shifting a level of an enable signal to generate a shifting enable signal. The internal voltage generation circuit device may include a pulse generation circuit configured for generating a first pulse and a second pulse in response to the shifting enable signal. The internal voltage generation circuit device may include a pulse synthesis circuit configured for synthesizing the first pulse and the second pulse to generate a synthesis pulse for driving an internal voltage. The first pulse has a pulse width which may be adjusted by a first variation rate in response to an external voltage, and the second pulse has a pulse width which may be adjusted by a second variation rate in response to the external voltage.

According to an embodiment, an internal voltage generation circuit device may be provided. The internal voltage generation circuit device may include a pulse generation circuit configured to generate a first pulse and a second pulse in response to an external voltage. The internal voltage generation circuit may include a pulse synthesis circuit configured for synthesizing the first pulse and the second pulse to generate a synthesis pulse.

Various embodiments of the present disclosure will be described hereinafter with reference to the accompanying drawings. However, the embodiments described herein are for illustrative purposes only and are not intended to limit the scope of the present disclosure.

Figure 1:
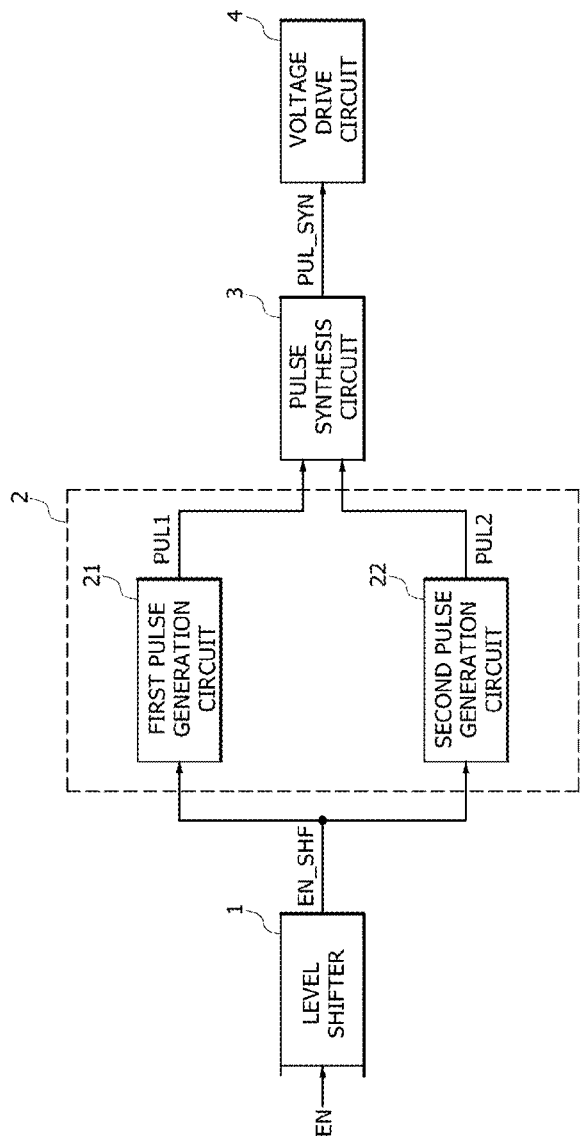
FIG. 1 is a block diagram illustrating a representation of an example an internal voltage generation circuit according to an embodiment.

Referring to FIG. 1, an internal voltage generation circuit according to an embodiment of the present disclosure may include a level shifter 1, a pulse generation circuit 2, a pulse synthesis circuit 3, and a voltage drive circuit 4.

The level shifter 1 may generate a shifting enable signal EN_SHF by level-shifting an enable signal EN. The enable signal EN may be a signal that is enabled to drive an internal voltage. The enable signal EN may swing in a range between an internal voltage and a ground voltage. A level of the enable signal EN which is enabled may be set to be different according to the embodiments. The shifting enable signal EN_SHF may swing in a range between an external voltage and the ground voltage. A swing width of the shifting enable signal EN_SHF may be set to be different according to the embodiments.

The pulse generation circuit 2 may include a first pulse generation circuit 21 and a second pulse generation circuit 22. The first pulse generation circuit 21 may include a passive element and may receive the shifting enable signal EN_SHF to generate a first pulse PUL1. The second pulse generation circuit 22 may include an inverter chain configured to include a plurality of MOS transistors and may receive the shifting enable signal EN_SHF to generate a second pulse PUL2. The first pulse PUL1 may have a pulse width which is adjusted by a first variation rate according to variation of the external voltage. The second pulse PUL2 may have a pulse width which is adjusted by a second variation rate according to variation of the external voltage. Each of the first and second variation rates may be set to a ratio of a variation amount of a pulse width to a variation amount of a power supply voltage. The second variation rate may be set to be greater than the first variation rate. In such a case, if a level of the external voltage is lowered, a pulse width difference between the second pulse PUL2 and the first pulse PUL1 may increase. The first pulse PUL1 may be set to have a logic low level during a section corresponding to a pulse width thereof. Similarly, the second pulse PUL2 may be set to have a logic low level during a section corresponding to a pulse width thereof. The first and second variation rates may be set to be different according to the embodiments.

The pulse synthesis circuit 3 may generate a synthesis pulse PUL_SYN by synthesizing the first pulse PUL1 and the second pulse PUL2. For example, the pulse synthesis circuit 3 may generate the synthesis pulse PUL_SYN having a pulse width that corresponds to a section obtained by subtracting a pulse width of the first pulse PUL1 from a pulse width of the second pulse PUL2. If the level of the external voltage is lowered, the section in which the pulse width of the second pulse PUL2 increases may become greater than a section in which the pulse width of the first pulse PUL1 increases. Thus, a pulse width of the synthesis pulse PUL_SYN may increase if the level of the external voltage is lowered. The synthesis pulse PUL_SYN may be set to have a logic low level during a section corresponding to a pulse width thereof.

The voltage drive circuit 4 may drive the internal voltage in response to the synthesis pulse PUL_SYN. For example, the voltage drive circuit 4 may drive the internal voltage to the external voltage during a section corresponding to the pulse width of the synthesis pulse PUL_SYN. If a level of the external voltage is lowered, the pulse width of the synthesis pulse PUL_SYN may increase. Thus, if a level of the external voltage is lowered, a section in which the internal voltage is driven by the external voltage may increase.

Figure 2:
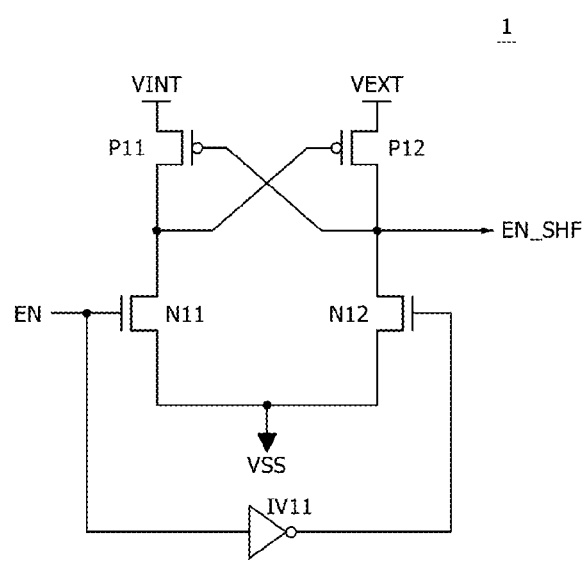
FIG. 2 is a circuit diagram illustrating a representation of an example of a level shifter included in the internal voltage generation circuit of FIG. 1.

Referring to FIG. 2, the level shifter 1 may include PMOS transistors P11 and P12, NMOS transistors N11 and N12, and an inverter IV11. In the level shifter 1, if the enable signal EN has a level of an internal voltage VINT, the NMOS transistor N11 and the PMOS transistor P12 may be turned on to drive the shifting enable signal EN_SHF to an external voltage VEXT. In the level shifter 1, if the enable signal EN has a level of a ground voltage VSS, the NMOS transistor N12 and the PMOS transistor P11 may be turned on to drive the shifting enable signal EN_SHF to the ground voltage VSS. The level shifter 1 may generate the shifting enable signal EN_SHF whose level swings in a range between the external voltage VEXT and the ground voltage VSS by shifting a level of the enable signal EN in a range between the internal voltage VINT and the ground voltage VSS.

Figure 3:
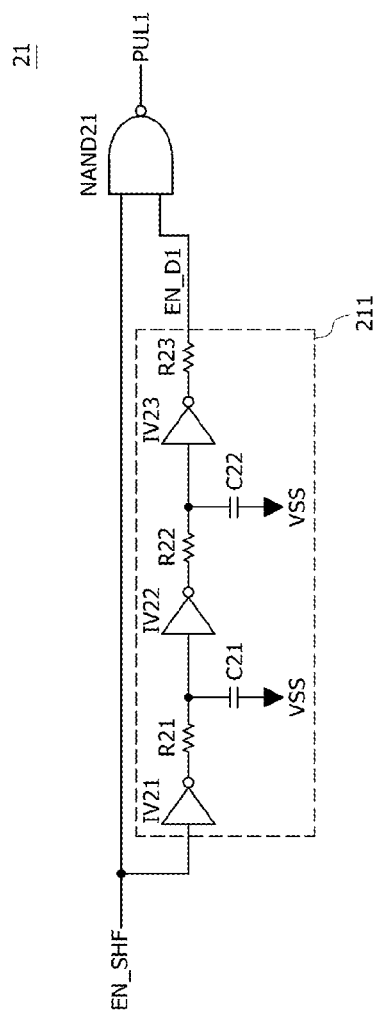
FIG. 3 is a circuit diagram illustrating a representation of an example an example of a first pulse generation circuit included in the internal voltage generation circuit of FIG. 1.

Referring to FIG. 3, the first pulse generation circuit 21 may include a first delay circuit 211 and a NAND gate NAND21. The first delay circuit 211 may inversely delay the shifting enable signal EN_SHF by a predetermined delay time to generate a first delay signal EN_D1. The first delay circuit 211 may include inverters IV21, IV22 and IV23, resistive elements R21, R22 and R23 and capacitive elements C21 and C22. Electrical characteristics of the resistive elements R21, R22 and R23 and the capacitive elements C21 and C22 corresponding to passive elements may be less affected by a level change of the external voltage VEXT, as compared to the inverters IV21, IV22 and IV23 which are realized using MOS transistors. A pulse width of the first pulse PUL1 generated by a NAND operation (i.e., not AND) of the shifting enable signal EN_SHF and the first delay signal EN_D1 using the NAND gate NAND21 may be set to correspond to a delay time of the first delay circuit 211.

Figure 4:
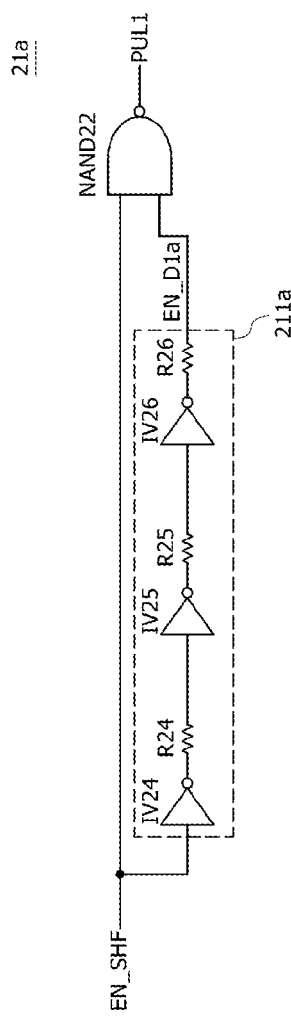
FIG. 4 is a circuit diagram illustrating a representation of an example of a first pulse generation circuit included in the internal voltage generation circuit of FIG. 1.

Referring to FIG. 4, a first pulse generation circuit 21a may include a first delay circuit 211a and a NAND gate NAND22. The first delay circuit 211a may inversely delay the shifting enable signal EN_SHF by a predetermined delay time to generate a first delay signal EN_D1a. The first delay circuit 211a may include inverters IV24, IV25 and IV26 and resistive elements R24, R25 and R26. Electrical characteristics of the resistive elements R24, R25 and R26 corresponding to passive elements may be less affected by a level change of the external voltage VEXT, as compared to the inverters IV24, IV25 and IV26 which are realized using MOS transistors. The pulse width of the first pulse PUL1 generated by a NAND operation of the shifting enable signal EN_SHF and the first delay signal EN_D1a using the NAND22 may be set to correspond to a delay time of the first delay circuit 211a.

Figure 5:
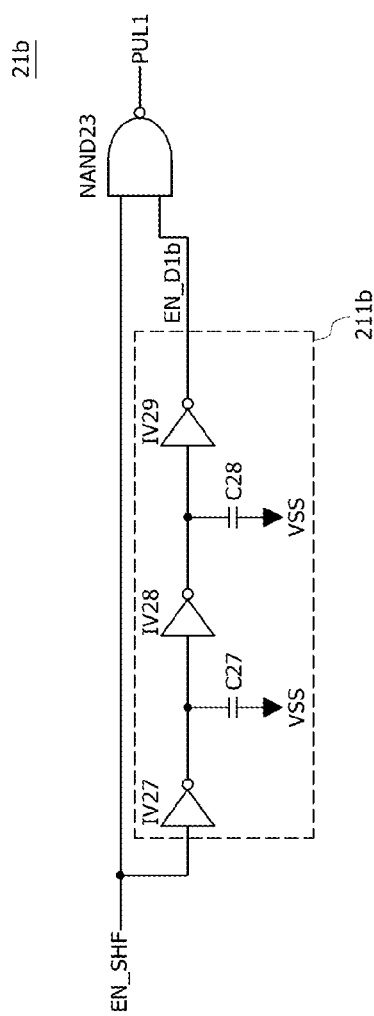
FIG. 5 is a circuit diagram illustrating a representation of an example of a first pulse generation circuit included in the internal voltage generation circuit of FIG. 1.

Referring to FIG. 5, a first pulse generation circuit 21b may include a first delay circuit 211b and a NAND gate NAND23. The first delay circuit 211b may inversely delay the shifting enable signal EN_SHF by a predetermined delay time to generate a first delay signal EN_D1b. The first delay circuit 211b may include inverters IV27, IV28 and IV29 and capacitive elements C27 and C28. The capacitive elements C27 and C28 corresponding to passive elements may be less affected by a level change of the external voltage VEXT, as compared to the inverters IV27, IV28 and IV29 which are realized using MOS transistors. The pulse width of the first pulse PUL1 generated by a NAND operation of the shifting enable signal EN_SHF and the first delay signal EN_D1b using the NAND23 may be set to correspond to a delay time of the first delay circuit 211b.

Figure 6:
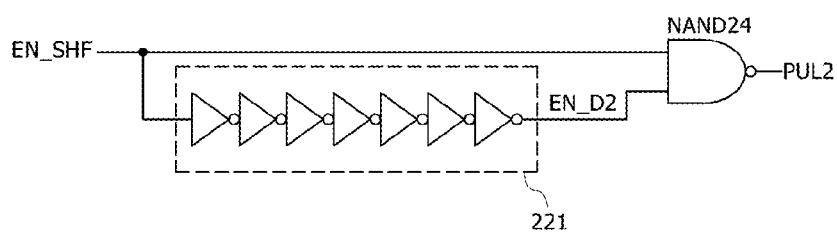
FIG. 6 is a circuit diagram illustrating a representation of an example of a second pulse generation circuit included in the internal voltage generation circuit of FIG. 1.

Referring to FIG. 6, the second pulse generation circuit 22 may include a second delay circuit 221 and a NAND gate NAND24. The second delay circuit 221 may inversely delay the shifting enable signal EN_SHF by a predetermined delay time to generate a second delay signal EN_D2. The second delay circuit 221 may be realized using an inverter chain. Since the second delay circuit 221 is realized using only an inverter chain without any passive elements, a delay time of the second delay circuit 221 may be set to be greater than a delay time of each of the first delay circuits 211, 211a and 211b which are described with reference to FIGS. 3 to 5, during a section in which a level of the external voltage VEXT is low. A pulse width of the second pulse PUL2 generated by a NAND operation of the shifting enable signal EN_SHF and the second delay signal EN_D2 using the NAND24 may be set to correspond to a delay time of the second delay circuit 221. As a level of the external voltage VEXT is lowered, a difference between a pulse width of the first pulse PUL1 and a pulse width of the second pulse PUL2 may increase.

Figure 7:
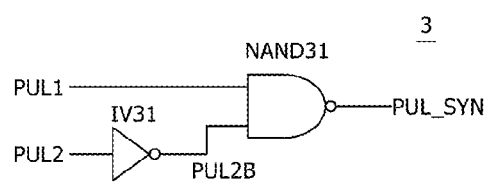
FIG. 7 is a circuit diagram illustrating a representation of an example of a pulse synthesis circuit included in the internal voltage generation circuit of FIG. 1.

Referring to FIG. 7, the pulse synthesis circuit 3 may include an inverter IV31 and a NAND gate NAND31. The inverter IV31 may inversely buffer the second pulse PUL2 to generate a second inverted pulse PUL2B. The NAND gate NAND31 may receive the first pulse PUL1 and the second inverted pulse PUL2B and may perform a NAND operation of the first pulse PUL1 and the second inverted pulse PUL2B to generate the synthesis pulse PUL_SYN. A pulse width of the synthesis pulse PUL_SYN having a logic low level may be set to a section obtained by subtracting a pulse width of the first pulse PUL1 from a pulse width of the second pulse PUL2. If a level of the external voltage VEXT is lowered, a pulse width of the synthesis pulse PUL_SYN may increase.

Figure 8:
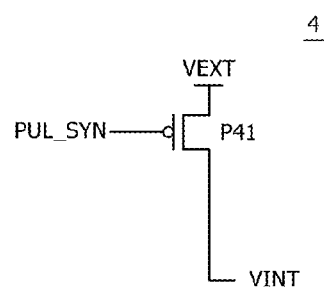
FIG. 8 is a circuit diagram illustrating a representation of an example an example of a voltage drive circuit included in the internal voltage generation circuit of FIG. 1.

Referring to FIG. 8, the voltage drive circuit 4 may include a PMOS transistor P41 which drives the internal voltage VINT to the external voltage VEXT in response to the synthesis pulse PUL_SYN. For example, the voltage drive circuit 4 may drive the internal voltage VINT to the external voltage VEXT during a pulse width section of the synthesis pulse PUL_SYN having a logic low level. If a level of the external voltage VEXT is lowered, a time period in which the voltage drive circuit 4 drives the internal voltage VINT to the external voltage VEXT may increase.

Figure 9:
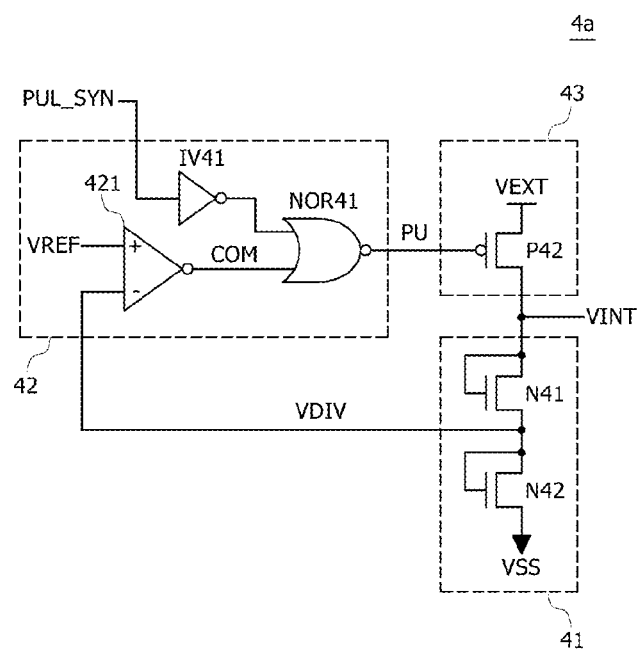
FIG. 9 is a circuit diagram illustrating a representation of an example of a voltage drive circuit included in the internal voltage generation circuit of FIG. 1.

Referring to FIG. 9, a voltage drive circuit 4a may include a voltage dividing circuit 41, a drive signal generation circuit 42 and a drive circuit 43. The voltage dividing circuit 41 may include NMOS transistors N41 and N42 and may generate a divided voltage VDIV by dividing the internal voltage VINT. The drive signal generation circuit 42 may include, for example, a comparator 421, an inverter IV41 and a NOR gate NOR41. The comparator 421 may generate a comparison signal COM having a logic low level if the divided voltage VDIV is higher than a reference voltage VREF and may generate the comparison signal COM having a logic high level if the divided voltage VDIV is lower than the reference voltage VREF. The NOR gate NOR41 may generate a pull-up signal PU which is enabled to a logic low level if at least one of the comparison signal COM and an output signal of the inverter IV41 has a logic high level. The drive circuit 43 may drive the internal voltage VINT to the external voltage VEXT if the pull-up signal PU is enabled to a logic low level. The voltage drive circuit 4a may drive the internal voltage VINT to the external voltage VEXT if the divided voltage VDIV is lower than the reference voltage VREF or may drive the internal voltage VINT to the external voltage VEXT during a time period corresponding to a pulse width of the synthesis pulse PUL_SYN having a logic low level. If a level of the external voltage VEXT is lowered, a time period in which the voltage drive circuit 4a drives the internal voltage VINT to the external voltage VEXT may increase.

Figure 10:
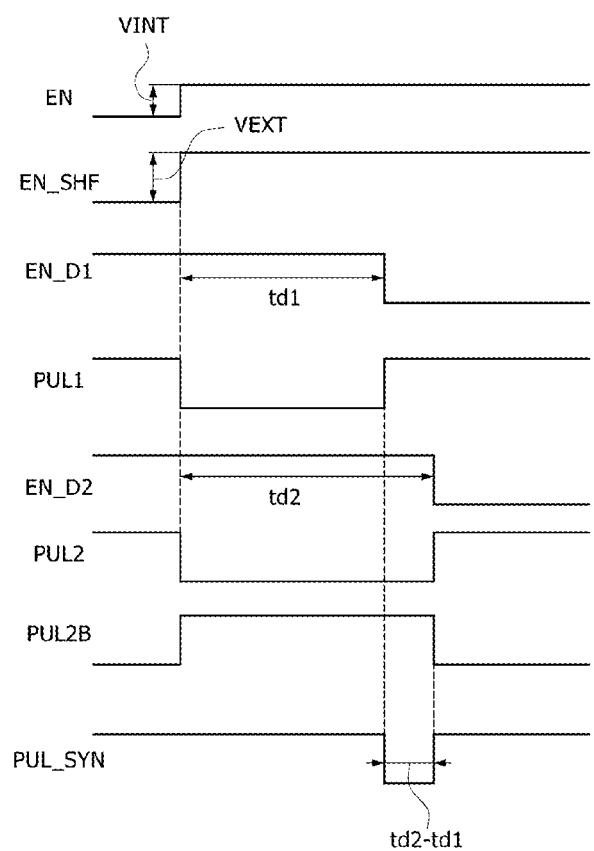
FIGS. 10 and 11 are timing diagrams illustrating representation of examples of an operation of the internal voltage generation circuit illustrated in FIGS. 1 to 9.
Figure 11:
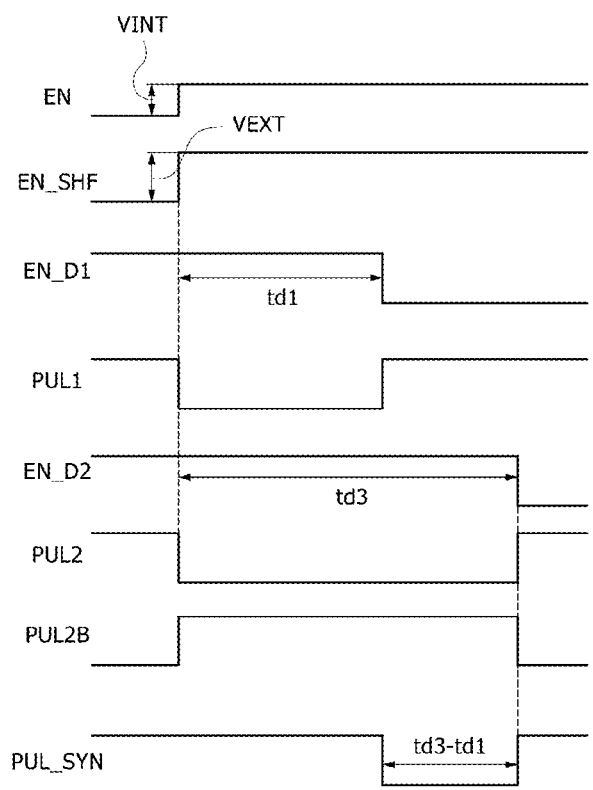

An operation of the internal voltage generation circuit having an aforementioned configuration will be described with reference to FIGS. 10 and 11. At this time, the operation will be described by dividing into cases in which the level of the external voltage VEXT is higher than or equal to a predetermined target level and cases in which the level of the external voltage VEXT is lower than or equal to the predetermined target level.

Operations of the internal voltage generation circuit having an aforementioned configuration will be described hereinafter with reference to FIGS. 10 and 11 in conjunction with an example in which the external voltage VEXT is higher than a predetermined target level and an example in which the external voltage VEXT is lower than the predetermined target level.

First, an operation of the internal voltage generation circuit will be described hereinafter with reference to FIG. 10 while the external voltage VEXT is higher than a predetermined target level.

The enable signal EN whose level swings in a range between the internal voltage VINT and the ground voltage VSS may be shifted to generate the shifting enable signal EN_SHF whose level swings in a range between the external voltage VEXT and the ground voltage VSS. The pulse width of the first pulse PUL1 may be set to correspond to a delay time td1 of the first delay signal EN_D1, and the pulse width of the second pulse PUL2 may be set to correspond to a delay time td2 of the second delay signal EN_D2. The synthesis pulse PUL_SYN may be generated to have a pulse width that is set to a logic low level during a section td2-td1 in which both of the first pulse PUL1 and the second inverted pulse PUL2B are generated to have a logic high level.

Next, an operation of the internal voltage generation circuit will be described hereinafter with reference to FIG. 11 while the external voltage VEXT is lower than a predetermined target level.

The enable signal EN whose level swings in a range between the internal voltage VINT and the ground voltage VSS may be shifted to generate the shifting enable signal EN_SHF whose level swings in a range between the external voltage VEXT and the ground voltage VSS. The pulse width of the first pulse PUL1 may be set to correspond to the delay time td1 of the first delay signal EN_D1, and the pulse width of the second pulse PUL2 may be set to correspond to a delay time td3 of the second delay signal EN_D2. The synthesis pulse PUL_SYN may be generated to have a pulse width that is set to a logic low level during a section td3-td1 in which both of the first pulse PUL1 and the second inverted pulse PUL2B are generated to have a logic high level.

The pulse width of the synthesis pulse PUL_SYN may be set to correspond to the section td3-td1 if the level of the external voltage VEXT is lower than the predetermined target level and may be set to correspond to the section td2-td1 less than the section td3-td1 if the level of the external voltage VEXT is higher than the predetermined target level. That is, if the level of the external voltage VEXT is lowered, the pulse width of the synthesis pulse PUL_SYN may increase. As described above, if the pulse width of the synthesis pulse PUL_SYN increases, a time period in which the internal voltage VINT is driven to the external voltage VEXT may increase. Thus, even though the level of the external voltage VEXT is lowered, a level of the internal voltage VINT may be fully driven to a level of the external voltage VEXT to prevent degradation of an operation speed of a semiconductor device employing the internal voltage generation circuit.

Figure 12:
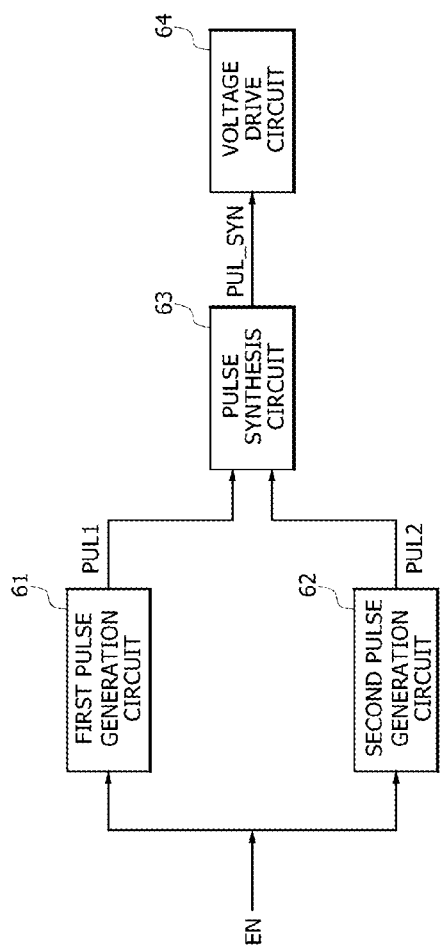
FIG. 12 is a block diagram illustrating a representation of an example an internal voltage generation circuit according to an embodiment.

Referring to FIG. 12, an internal voltage generation circuit according to an embodiment of the present disclosure may include a first pulse generation circuit 61, a second pulse generation circuit 62, a pulse synthesis circuit 63, and a voltage drive circuit 64.

The first pulse generation circuit 61 may include passive elements and may receive an enable signal EN to generate a first pulse PUL1. The first pulse PUL1 may have a pulse width which is adjusted by a first variation rate according to variation of an external voltage.

The second pulse generation circuit 62 may include an inverter chain realized using MOS transistors and may receive the enable signal EN to generate a second pulse PUL2. The second pulse PUL2 may have a pulse width which is adjusted by a second variation rate according to a change of the external voltage. Each of the first and second variation rates may be set to a ratio of a variation amount of a pulse width to a variation amount of a power supply voltage. The second variation rate may be set to be greater than the first variation rate. In such a case, if a level of the external voltage is lowered, a pulse width difference between the second pulse PUL2 and the first pulse PUL1 may increase. The first pulse PUL1 may be set to have a logic low level during a section corresponding to a pulse width thereof. Similarly, the second pulse PUL2 may be set to have a logic low level during a section corresponding to a pulse width thereof. The first and second variation rates may be set to be different according to the embodiments.

The pulse synthesis circuit 63 may generate a synthesis pulse PUL_SYN by synthesizing the first pulse PUL1 and the second pulse PUL2. For example, the pulse synthesis circuit 63 may generate the synthesis pulse PUL_SYN having a pulse width corresponding to a section obtained by subtracting a pulse width of the first pulse PUL1 from a pulse width of the second pulse PUL2. If the level of the external voltage is lowered, the section in which the pulse width of the second pulse PUL2 increases may become greater than a section in which the pulse width of the first pulse PUL1 increases. Thus, a pulse width of the synthesis pulse PUL_SYN may increase if the level of the external voltage is lowered. The synthesis pulse PUL_SYN may be set to have a logic low level during a section corresponding to a pulse width thereof.

The voltage drive circuit 64 may drive an internal voltage in response to the synthesis pulse PUL_SYN. For example, the voltage drive circuit 64 may drive the internal voltage to the external voltage during a section corresponding to the pulse width of the synthesis pulse PUL_SYN. If a level of the external voltage is lowered, the pulse width of the synthesis pulse PUL_SYN may increase. Thus, if a level of the external voltage is lowered, a section in which the internal voltage is driven to the external voltage may increase.

The internal voltage generation circuit described with reference to FIG. 12 may have substantially the same configuration as the internal voltage generation circuit described with reference to FIG. 1 except that the internal voltage generation circuit described with reference to FIG. 12 does not include a level shifter of FIG. 1. Thus, detailed descriptions of elements of the internal voltage generation circuit illustrated in FIG. 12 will be omitted.

Figure 13:
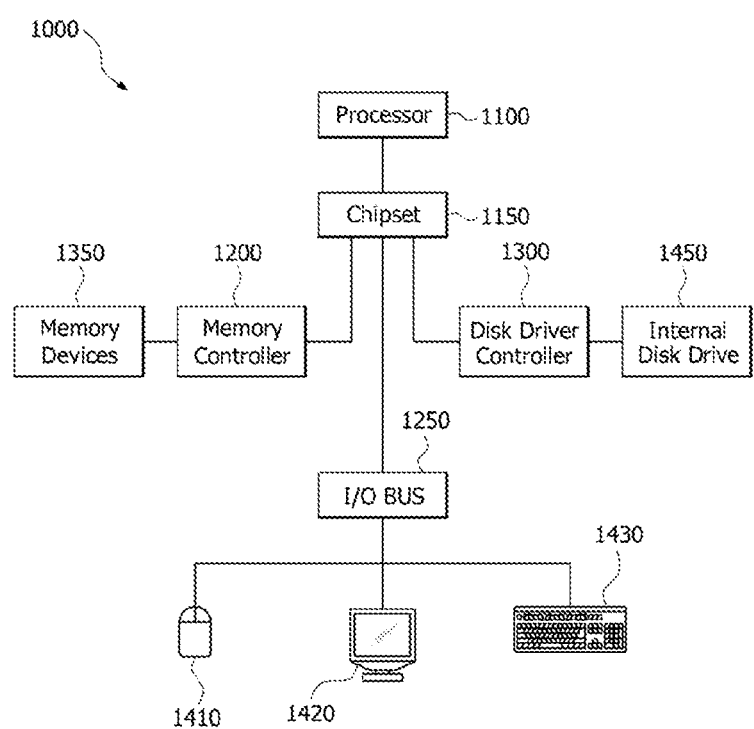
FIG. 13 illustrates a block diagram of an example of a representation of a system employing an internal voltage generation circuit with the various embodiments discussed above with relation to FIGS. 1-12.

The internal voltage generation circuits discussed above (see FIGS. 1-12) are particular useful in the design of memory devices, processors, and computer systems. For example, referring to FIG. 13, a block diagram of a system employing a internal voltage generation circuit in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one internal voltage generation circuit as discussed above with reference to FIGS. 1-12. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one internal voltage generation circuit as discussed above with relation to FIGS. 1-12, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 13 is merely one example of a system 1000 employing an internal voltage generation circuit as discussed above with relation to FIGS. 1-12. In alternate embodiments, such as, for example but not limited to, cellular phones or digital cameras, the components may differ from the embodiments illustrated in FIG. 13.

What is claimed is:

1. An internal voltage generation circuit comprising:
a first pulse generation circuit configured for generating a first pulse having a pulse width which is adjusted by a first variation rate in response to an external voltage;
a second pulse generation circuit configured for generating a second pulse having a pulse width which is adjusted by a second variation rate in response to the external voltage; and
a pulse synthesis circuit configured for synthesizing the first pulse and the second pulse to generate a synthesis pulse for driving an internal voltage, wherein the pulse synthesis circuit generates the synthesis pulse having a pulse width that corresponds to a section obtained by subtracting a pulse width of the first pulse from a pulse width of the second pulse.

2. The circuit of claim 1,
wherein the first variation rate is set to a ratio of a variation amount of a pulse width of the first pulse to a variation amount of a level of the external voltage; and
wherein the second variation rate is set to a ratio of a variation amount of a pulse width of the second pulse to a variation amount of a level of the external voltage.

3. The circuit of claim 1, wherein the second variation rate is set to be greater than the first variation rate.

4. The circuit of claim 1, wherein a difference between a pulse width of the first pulse and a pulse width of the second pulse increases if a level of the external voltage is lowered.

5. The circuit of claim 1,
wherein the first pulse generation circuit is configured to include a passive element; and
wherein the first pulse generation circuit generates a delay signal from an input signal thereof and generates the first pulse from the input signal and the delay signal.

6. The circuit of claim 5, wherein the passive element is configured to include a resistive element, a capacitive element or a combination thereof.

7. The circuit of claim 1, wherein the first pulse generation circuit includes:
a delay circuit configured for including a passive element and configured for delaying an input signal by a predetermined delay time to generate a delay signal; and
a logic element configured for generating the first pulse in response to the input signal and the delay signal.

8. The circuit of claim 1,
wherein the second pulse generation circuit is configured to include at least one MOS transistor; and
wherein the second pulse generation circuit generates a delay signal from an input signal thereof and generates the second pulse from the input signal and the delay signal.

9. The circuit of claim 1, wherein the second pulse generation circuit includes:
a delay circuit configured for including an inverter chain which is configured to include MOS transistors and configured for delaying an input signal by a predetermined delay time to generate a delay signal; and
a logic element configured for generating the first pulse in response to the input signal and the delay signal.

10. The circuit of claim 1, wherein the internal voltage is driven during a section corresponding to a pulse width of the synthesis pulse.

11. An internal voltage generation circuit comprising:
a level shifter configured for shifting a level of an enable signal to generate a shifting enable signal;
a pulse generation circuit configured for generating a first pulse and a second pulse in response to the shifting enable signal; and
a pulse synthesis circuit configured for synthesizing the first pulse and the second pulse to generate a synthesis pulse for driving an internal voltage,
wherein the first pulse has a pulse width which is adjusted by a first variation rate in response to an external voltage,
wherein the second pulse has a pulse width which is adjusted by a second variation rate in response to the external voltage, and
wherein the pulse synthesis circuit generates the synthesis pulse having a pulse width that corresponds to a section obtained by subtracting a pulse width of the first pulse from a pulse width of the second pulse.

12. The circuit of claim 11, wherein the enable signal swings in a range between the internal voltage and a ground voltage, and the shifting enable signal swings in a range between the external voltage and the ground voltage.

13. The circuit of claim 11,
wherein the first variation rate is set to a ratio of a variation amount of a pulse width of the first pulse to a variation amount of a level of the external voltage; and
wherein the second variation rate is set to a ratio of a variation amount of a pulse width of the second pulse to a variation amount of a level of the external voltage.

14. The circuit of claim 11, wherein the second variation rate is greater than the first variation rate.

15. The circuit of claim 11, wherein a difference between a pulse width of the first pulse and a pulse width of the second pulse increases if a level of the external voltage is lowered.

16. The circuit of claim 11,
wherein the pulse generation unit includes a first pulse generation circuit configured for generating the first pulse from the shifting enable signal;
wherein the first pulse generation circuit includes a passive element; and
wherein the first pulse generation circuit generates a delay signal from the shifting enable signal and generates the first pulse from the shifting enable signal and the delay signal.

17. The circuit of claim 16, wherein the passive element is configured to include resistive element, a capacitive element or a combination thereof.

18. The circuit of claim 11,
wherein the pulse generation unit includes a second pulse generation circuit configured for generating the second pulse from the shifting enable signal;
wherein the second pulse generation circuit includes at least one MOS transistor; and
wherein the second pulse generation circuit generates a delay signal from the shifting enable signal and generates the second pulse from the shifting enable signal and the delay signal.

* * * * *